(12) United States Patent
Chang

(10) Patent No.: US 6,884,473 B2
(45) Date of Patent: Apr. 26, 2005

(54) METHOD FOR FABRICATING METAL SILICIDE

(75) Inventor: Kent Kuohua Chang, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 107 days.

(21) Appl. No.: 10/248,177

(22) Filed: Dec. 24, 2002

(65) Prior Publication Data

US 2004/0121592 A1 Jun. 24, 2004

(51) Int. Cl.$^7$ ................................................. C23C 14/06
(52) U.S. Cl. ............ 427/530; 427/255.7; 427/255.392; 427/255.393
(58) Field of Search ................ 427/255.7, 530, 427/255.392, 255.393

(56) References Cited

U.S. PATENT DOCUMENTS

| | | | | |
|---|---|---|---|---|
| 4,557,037 A | * | 12/1985 | Hanoka et al. | 438/57 |
| 4,619,034 A | * | 10/1986 | Janning | 438/158 |
| 5,804,249 A | * | 9/1998 | Sukharev et al. | 427/99 |
| 5,888,588 A | * | 3/1999 | Nagabushnam et al. | 427/248.1 |
| 6,372,598 B2 | * | 4/2002 | Kang et al. | 438/399 |

* cited by examiner

*Primary Examiner*—Bret Chen
(74) *Attorney, Agent, or Firm*—Jianq Chyun IP Office

(57) ABSTRACT

A method for fabricating a metal silicide layer includes forming a dielectric layer on a substrate, followed by forming a polysilicon material conductive layer on the dielectric layer. An adhesion layer is then formed on the conductive layer, wherein the adhesion layer is a nitrogen rich layer or a nitrogen ion implanted layer. A metal silicide layer is then formed on the adhesion layer. The adhesion between the metal silicide layer and the conductive layer is more desirable due the adhesion layer.

17 Claims, 4 Drawing Sheets

METHOD FOR FABRICATING METAL SILICIDE

BACKGROUND OF INVENTION

1. Field of Invention

The present invention relates to a method for fabricating a semiconductor device. More particularly, the present invention relates to a method for fabricating metal silicide on polysilicon.

2. Description of Related Art

As the integration of semiconductor device increases, the pattern and the line width in the device gradually decrease. The contact resistance of the gate and the conductive line in the device thereby increases, leading to a higher RC delay and adversely affecting the operating speed. Since the resistance of metal silicide is lower than polysilicon and the thermal stability of metal silicide is higher than a typical inter-metal dielectric material, forming metal silicide on a gate can lower the resistance between the gate and the metal interconnect.

During the conventional fabrication method for metal silicide, after a polysilicon layer, for example, a gate, is formed on a semiconductor wafer and before the semiconductor wafer is subjected to a thermal process for forming metal silicide, the semiconductor wafer is, exposed to the environment for an extended period of time. A thin native oxide layer is grown on the polysilicon layer of the semiconductor wafer. Therefore, as the semiconductor wafer is being subjected to the thermal process for forming metal silicide, the adhesion between the metal silicide and the polysilicon layer is undesirable due to the presence of the native oxide layer. Metal silicide is easily peeled off the polysilicon layer, adversely affecting the reliability and the effectiveness of the device.

SUMMARY OF INVENTION

Accordingly, the present invention provides a fabrication method for metal silicide, wherein the formation of a native oxide layer on a polysilicon layer is prevented.

The present invention provides a fabrication method for metal silicide, wherein the adhesion between metal silicide and the polysilicon layer is enhanced.

In accordance to the fabrication method for metal silicide of the present invention, a dielectric layer is formed over a substrate, followed by forming a polysilicon type of conductive layer on the dielectric layer. An adhesion layer is then formed over the conductive layer, wherein this adhesion layer is a nitrogen rich film or a nitrogen ion implanted film. A metal silicide layer is further formed on the adhesion layer.

Additionally, after the conductive layer and before the adhesion layer are formed, a deglaze process is conducted on the conductive layer to provide the conductive layer a rougher surface and to remove impurities or the native oxide layer.

Since a nitrogen-containing adhesion layer is formed on the surface of the conductive layer, the generation of a native oxide layer is thus suppressed by the adhesion layer. The adhesion between the subsequently formed metal silicide layer and the conductive layer is thus desirable and the problem of peeling is prevented.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

FIGS. 1A to 1D are schematic cross-sectional views illustrating the process flow for fabricating metal silicide according to the first aspect of the present invention.

Figure 1A:
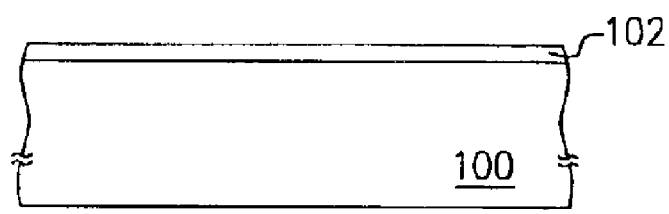
FIGS. 1A to 1D are schematic cross-sectional views illustrating the process flow for fabricating metal silicide according to a first aspect of the present invention.

Referring to FIG. 1A, a dielectric layer 102 is provided over a substrate 100, wherein the dielectric layer 102 is formed with a material, such as, silicon oxide. The dielectric layer 102 is formed by, for example, thermal oxidation. This dielectric layer 102 is used as, for example, the gate dielectric layer of the semiconductor device.

Figure 1B:
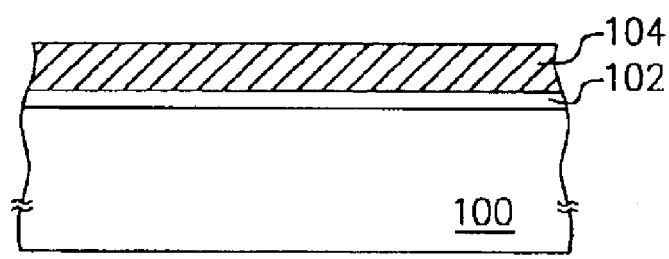

Referring to FIG. 1B, a conductive layer 104 is formed on the dielectric layer 102, wherein the conductive layer 104 is formed with, for example, doped polysilicon. Forming the conductive layer 104 is by, for example, performing an in-situ ion doping using chemical vapor deposition (CVD) to form a doped polysilicon layer on the substrate 100. This conductive layer 104 serves as, for example, the gate of the semiconductor device.

Figure 1C:
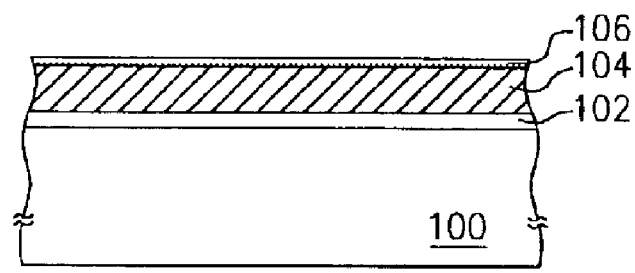

Continuing to FIG. 1C, an adhesion layer 106 is formed on the conductive layer 104, wherein the adhesion layer 106 is, for example, a nitrogen rich film. The adhesion layer 106 is formed by, for example, chemical vapor deposition, wherein nitrogen ions at a concentration of about $2 \times 10^{18}$ atoms/cm$^3$ to $5 \times 10^{19}$ atoms/cm$^3$ are deposited in-situ on the conductive layer 104. The adhesion layer 106 is about 5 angstroms to 40 angstroms thick. Since the adhesion layer 106 comprises nitrogen, the generation of a native oxide layer on the surface of the conductive layer 104 is suppressed.

Figure 1D:
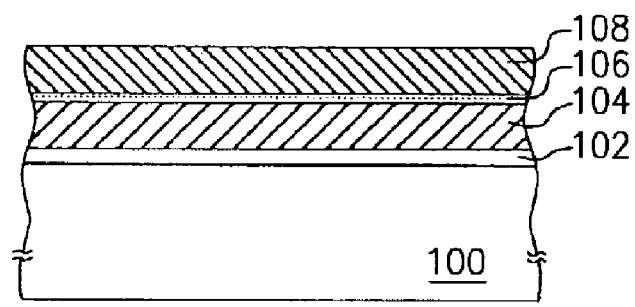

Continuing to FIG. 1D, a metal silicide layer 108 is formed on the adhesion layer 106, wherein the metal silicide layer 108 includes titanium silicide (TiSix), tungsten silicide (WSix), tantalum silicide (TaSix), molybdenum silicide (MoSix), cobalt silicide (CoSix) or nickel silicide (NiSix). Forming the metal silicide layer 108 comprises, for example, forming a metal layer (not shown) on the adhesion layer 106. A high temperature process is then performed for the metal in the metal layer to react with the doped polysilicon in the conductive layer to form the metal silicide layer 108. The metal silicide layer 108 can also be formed by chemical vapor deposition or sputtering to form the metal silicide layer 108 directly on the adhesion layer 106. Since the metal silicide layer 108 is formed on the adhesion layer 106, the metal silicide layer 108 can effectively adhere to the conductive layer 104 and is prevented from detaching from the conductive layer 104.

Besides forming the adhesion layer by chemical vapor deposition, the present invention also provides other methods to form the adhesion layer. Referring to FIGS. 2A to 2B, FIGS. 2A to 2D are schematic cross-sectional views illustrating the process flow for fabricating metal silicide according to the second aspect of the present invention.

Figure 2A:
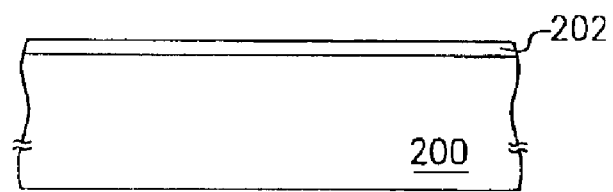
FIGS. 2A to 2D are schematic cross-sectional views illustrating the process flow for fabricating metal silicide according to a second aspect of the present invention.

Referring to FIG. 2A, a dielectric layer 202 is provided on a substrate 200, wherein the dielectric layer 202 is, for example, silicon oxide. The dielectric layer 202 is formed by, for example, thermal oxidation. Further, this dielectric layer 202 is used as, for example, a gate dielectric layer for a semiconductor device.

Figure 2B:
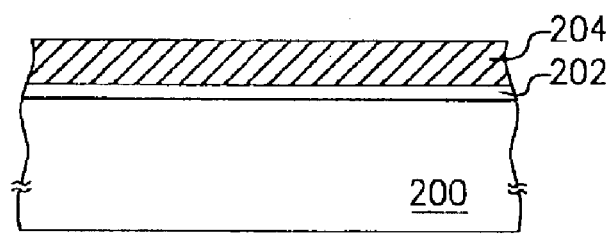

Continuing to FIG. 2B, a conductive layer 204 is formed on the dielectric layer 202, wherein the conductive layer 204 is, for example, doped polysilicon. Forming the conductive layer 204 is by, for example, an in situ ion doping method, using chemical vapor deposition to form a doped polysilicon layer on the substrate 200. This conductive layer 204 is used as, for example, a gate of a semiconductor device.

Figure 2C:
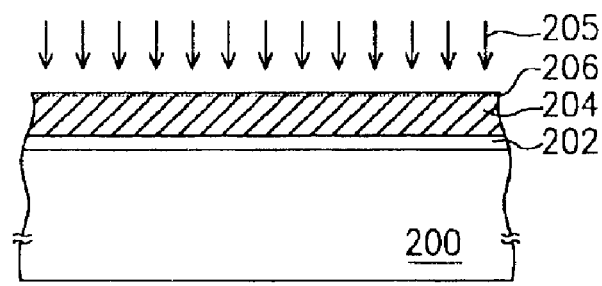

Thereafter, as shown in FIG. 2C, an ion implantation process 205 is performed on the conductive layer 204 to form an adhesion layer 206, wherein the adhesion layer 206 is, for example, a nitrogen ion implanted film. The adhesion layer 206 is formed by implanting, for example, nitrogen ions at a concentration of about $2 \times 10^{18}$ atoms/cm$^3$ to $5 \times 10^{19}$ atoms/cm$^3$ using 1000 to 5000 electron volts of power. The adhesion layer 206 is about 20 angstroms thick. Similarly, the adhesion layer 206 comprises nitrogen, the generation of a native oxide layer on surface of the conductive layer 204 can be suppressed.

Figure 2D:
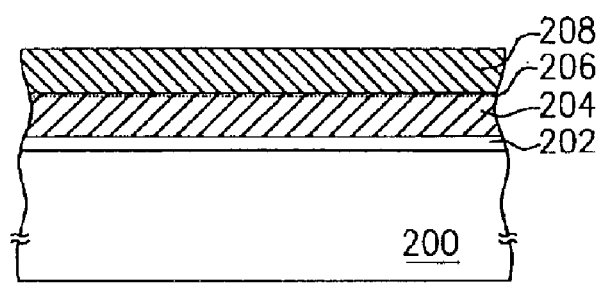

Continuing to FIG. 2D, a metal silicide layer 208 is then formed on the adhesion layer 206, wherein the metal silicide layer 208 includes titanium silicide (TiSix), tungsten silicide (WSix), tantalum silicide (TaSix), molybdenum silicide (MoSix), cobalt silicide (CoSix) or nickel silicide (NiSix). The metal silicide layer 108 is formed by, for example, forming a metal layer (not shown) on the adhesion layer 106, followed by using a thermal process for the metal in the metal layer to react with the doped polysilicon in the conductive layer to form the metal silicide layer 208. The metal silicide layer 208 can also be formed by, for example, using chemical vapor deposition method or sputtering method to form the metal silicide layer 208 on the adhesion layer 206. Similar to the first aspect of the present invention, the adhesion of the metal silicide layer 108 to the conductive layer 206 is desirable due to the adhesion layer 206.

Further, in the above first and second aspects of the present invention, after the formation of the conductive layer 104, 204 and before the formation of the adhesion layer 106, 206, a deglaze process is conducted on the conductive layer 104, 204 to provide a rougher surface for the conductive layer 104, 204 in order to increase the adhesion property and to remove other impurities or the native oxide layer. The deglaze process includes etching with a hydrofluoric acid gas.

Moreover, the fabrication method for metal silicide according to the present invention is not limited to a dielectric layer (gate oxide layer)—conductive layer (gate) structure. The fabrication method of the present invention is also applicable to devices with other types of gate structure, for example, a nitride read-only memory device formed with silicon oxide, silicon nitride, silicon oxide and control gate, or the read only memory device formed with a tunnel oxide layer, a floating gate, an inter-polysilicon dielectric layer and a control gate. The fabrication for these devices includes forming a control gate on a semiconductor device, followed by forming a metal silicide layer on the control gate according to the manufacturing process illustrated in FIGS. 1C to 1D.

In accordance to the present invention, a nitrogen-containing adhesion layer is formed on the surface of the polysilicon material conductive layer to suppress the generation of a native oxide layer on the adhesion layer. The adhesion between the subsequently formed metal silicide layer and the conductive layer is thus desirable and the problem of peeling is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a metal silicide, comprising:
   providing a substrate, wherein the substrate comprises a dielectric layer formed thereon;
   forming a conductive layer on the dielectric layer, wherein the conductive layer comprises a nitrogen rich film formed within a top surface thereof, wherein the conductive layer is formed by performing a chemical vapor deposition process to form a doped polysilicon layer and then nitrogen ions are implanted on the doped polysilicon layer to form the nitrogen rich film within a top surface of the doped polysilicon layer; and
   forming a metal silicide layer on the conductive layer.

2. The method of claim 1, further comprising a step of performing a deglaze on the conductive layer before the step of forming the metal silicide layer on the conductive layer.

3. The method of claim 1, wherein a thickness of the nitrogen rich film is about 20 angstroms.

4. The method of claim 1, wherein the metal silicide layer is formed with a material selected from a group consisting of titanium silicide (TiSix), tungsten silicide (WSix), tantalum silicide (TaSix), molybdenum silicide (MoSix), cobalt silicide (CoSix) and nickel suicide (NiSix).

5. The fabrication method of claim 1, wherein the conductive layer comprises a polysilicon layer.

6. A fabrication method of a metal silicide layer, comprising:
   providing a substrate, wherein the substrate comprises a dielectric layer formed thereon;
   forming a conductive layer on the dielectric layer;
   performing an implantation process on the conductive layer to introduce nitrogen ions into a surface of the conductive layer to form a nitrogen rich film within a surface of the conductive layer; and
   forming a metal silicide layer an the conductive layer.

7. The method of claim 6, further comprising a step of performing a deglaze process before the step of performing an implantation process.

8. The method of claim 7, wherein the deglaze process comprises performing an etching using a hydrofluoric acid gas.

9. The method of claim 6, wherein the implantation process comprises using a power of about 1000 electron volts to about 5000 electron volts and a concentration of the nitrogen ions of about $2 \times 10^{18}$ atoms/cm$^3$ to $5 \times 10^{19}$ atoms/cm$^3$.

10. The method of claim 6, wherein the nitrogen rich film is about 20 angstroms thick.

11. The method of claim 6, where the metal silicide layer is formed with a material selected from a group consisting of titanium silicide (TiSix), tungsten silicide (WSix), tantalum silicide (TaSix), molybdenum silicide (MoSix), cobalt silicide (CoSix) and nickel silicide (NiSix).

12. The method of claim 6, wherein the conductive layer includes polysilicon.

13. A method for fabricating a metal silicide, comprising:
   providing a substrate, where the substrate comprises a dielectric layer formed thereon;
   forming a conductive layer on the dielectric layer, wherein the conductive layer comprises a nitrogen rich film formed within a top surface thereof, wherein the conductive layer is formed via a chemical vapor deposition process, and nitrogen ions are introduced in-situ to form the nitrogen rich film within the top surface of the conductive layer; and forming a metal silicide layer on the conductive layer.

14. The method of claim 13, further comprising a step of performing a deglaze on the conductive layer before the step of forming the metal silicide layer on the conductive layer.

15. The method of claim 13, wherein a thickness of the nitrogen rich film is about 20 angstroms.

16. The method of claim 13, wherein the metal silicide layer is formed with a material selected from a group consisting of titanium silicide (TiSix), tungsten silicide (WSix), tantalum silicide (TaSix), molybdenum silicide (MoSix), cobalt silicide (CoSix) and nickel silicide (NiSix).

17. The fabrication method of claim 13, wherein the conductive layer comprises a polysilicon layer.

* * * * *